(12) United States Patent
Park et al.

(10) Patent No.: US 10,147,718 B2
(45) Date of Patent: Dec. 4, 2018

(54) ELECTROSTATIC DISCHARGE (ESD) PROTECTION FOR THE METAL OXIDE MEDICAL DEVICE PRODUCTS

(71) Applicant: DPIX, LLC, Colorado Springs, CO (US)

(72) Inventors: Byung-Kyu Park, Colorado Springs, CO (US); Karthik Nagarajan, Colorado Springs, CO (US); Jungwon Park, Colorado Springs, CO (US); Yang-Wen Chen, Fremont, CA (US); Ick-Hwan Ko, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 15/790,409

(22) Filed: Oct. 23, 2017

(65) Prior Publication Data

US 2018/0130790 A1 May 10, 2018

Related U.S. Application Data

(60) Provisional application No. 62/417,974, filed on Nov. 4, 2016.

(51) Int. Cl.
*H01L 27/02* (2006.01)
*H01L 29/786* (2006.01)
*G02F 1/1362* (2006.01)
(Continued)

(52) U.S. Cl.
CPC .... *H01L 27/0266* (2013.01); *G02F 1/136204* (2013.01); *H01L 27/0288* (2013.01);
(Continued)

(58) Field of Classification Search
CPC ............. H01L 27/0266; H01L 29/7869; H01L 27/0288; H01L 27/78696; H01L 28/40; H01L 27/14758; H01L 27/0296; H01L 27/0292; H01L 27/14658; H01L 27/02; H01L 27/146; G02F 1/136204
(Continued)

(56) References Cited

U.S. PATENT DOCUMENTS 5,744,837 A * 4/1998 Kamiura ........... G02F 1/136204
257/355
7,839,612 B1 * 11/2010 Chan ................... H01L 27/0285
361/56
(Continued)

*Primary Examiner* — Alexander Oscar Williams
(74) *Attorney, Agent, or Firm* — Slater Matsil, LLP

(57) ABSTRACT

An ESD circuit includes a first metal oxide channel device having a drain coupled to a first node, a source coupled to a second node, and a gate coupled to the first node; a second metal oxide channel device having a source coupled to the first node, a drain coupled to the second node, and a gate coupled to the second node; a first capacitor coupled between the first and second nodes proximate to the first metal oxide channel device; and a second capacitor coupled between the first and second nodes proximate to the second metal oxide channel device. The ESD circuit can further include a third capacitor coupled between the first and second nodes proximate to the first capacitor. The ESD circuit can further include a fourth capacitor coupled between the first and second nodes proximate to the second capacitor.

20 Claims, 14 Drawing Sheets

(51) Int. Cl.
    *H01L 27/146* (2006.01)
    *H01L 49/02* (2006.01)
(52) U.S. Cl.
    CPC ...... *H01L 27/0292* (2013.01); *H01L 27/0296* (2013.01); *H01L 27/14658* (2013.01); *H01L 29/7869* (2013.01); *H01L 29/78696* (2013.01); *H01L 28/40* (2013.01)
(58) Field of Classification Search
    USPC .......................................................... 257/43
    See application file for complete search history.

(56) References Cited

U.S. PATENT DOCUMENTS

| | | | | |
|---|---|---|---|---|
| 8,498,166 B1* | 7/2013 | Peachey | ................... | G11C 7/02 365/154 |
| 9,172,241 B2* | 10/2015 | Chen | ....................... | H02H 9/046 |
| 9,880,432 B2* | 1/2018 | Lim | .................... | G02F 1/136204 |
| 2010/0084654 A1* | 4/2010 | Yamazaki | ............ | H01L 27/0248 257/43 |
| 2012/0180008 A1* | 7/2012 | Gist, III | .................... | H02H 9/04 716/101 |
| 2013/0106467 A1* | 5/2013 | Mansri | ................. | H03K 17/145 327/108 |
| 2013/0235497 A1* | 9/2013 | Ma | .......................... | H02H 9/046 361/56 |
| 2014/0268444 A1* | 9/2014 | Bertin | ................. | H01L 27/0266 361/56 |
| 2015/0293417 A1* | 10/2015 | Lim | ................... | G02F 1/136204 361/56 |
| 2015/0380397 A1* | 12/2015 | Dabral | ................ | H01L 27/0266 361/56 |
| 2017/0256933 A1* | 9/2017 | Chen | ....................... | H02H 9/046 |

* cited by examiner

ELECTROSTATIC DISCHARGE (ESD) PROTECTION FOR THE METAL OXIDE MEDICAL DEVICE PRODUCTS

CROSS-REFERENCE TO RELATED APPLICATIONS

This application claims the benefit of U.S. Provisional Application No. 62/417,974, filed on Nov. 4, 2016, which application is hereby incorporated herein by reference.

TECHNICAL FIELD

The present invention relates generally to a system and method of providing a sensor array for medical applications, and, in particular embodiments, to a system and method for providing electro-static discharge (ESD) protection for the sensor array.

BACKGROUND

Amorphous silicon transistors have been used in imaging detectors and sensor arrays for medical applications such as X-ray imaging. While the advantages of amorphous silicon transistors in these applications are well known, there are limits to the switching speed of these transistors. What is desired is an imaging detector or sensor array using an alternative technology that supports higher switching frequencies than those associated with amorphous silicon technology, while at the same time compensating for any performance limitations associated with the alternative technology. The performance of medical devices using the alternative technology is thus increased with respect to the performance of medical devices using the amorphous silicon technology.

SUMMARY

The bottom gate thin film transistor (TFT) has been widely used in an amorphous silicon based backplane architectures for medical imaging detectors and display fields. Recently, metal oxide backplane medical imaging device is used as the channel layer of thin film transistor (TFT) due to its fast switching speed with higher field effect mobility compared to that of amorphous Si. Thus, an integration scheme of one uprising metal oxide technology and conventional manufacturing process for medical applications is described below. Metal Oxide films are used to provide a fast switching device. Such devices, however, are vulnerable to the excess existence of hydrogen during fabrication since its majority carrier is oxygen vacancies in ionic bonding. Metal oxide devices according to embodiments are therefore fabricated to consider balancing the threshold voltage down, in a negative voltage direction. But adjustments to the threshold voltage inevitably induce a large amount of current flow to the back-to-back transistors of an ESD circuit, which was originally built to prevent the excess current flowing to the active matrix device. Described in further detail below is a novel scheme to capture the benefits of a high mobility metal oxide based active matrix device, and the stable operation of a metal oxide based back-to-back switching transistor ESD protection circuit. An advanced (ESD) protection circuit using a back-to-back transistor design is described, which allows a proscribed level of low frequency signals only. High frequency signals are cut-off through the ESD protection circuit to help provide a stable operation of the associated medical imaging detector. Using the metal oxide technology for the sensor array and ESD protection circuit is beneficial for medical applications by exploiting the benefits of metal oxide's high mobility and stable operation.

Embodiments of the invention provide a method and circuit design for fabricating a flat panel device for medical applications. The sensor array comprises metal oxide based switching devices, and either inorganic or organic photodiodes for imaging, such as x-ray detection. The ESD protection circuit according to embodiment uses metal oxide based switching devices.

A conventional medical application backplane is comprised of amorphous silicon based switching devices and photodiode process. Even though amorphous silicon has lower field-effect mobility than polycrystalline silicon based switching device, it has been widely used for the display industry as well as the medical application device industry due to its low fabrication costs and lower leakage current. A low mobility, however, provides an obstacle for advanced detector designs.

Thus, a transparent metal oxide (including but not limited to oxides of Indium, Zinc, Gallium, Hafnium, and Aluminum) material is used in embodiments to overcome the drawback of currently used silicon (amorphous and Low Temperature PolySilicon (LTPS)) based switching devices. Metal oxide devices have higher mobility characteristics than amorphous silicon based switching devices. Metal Oxide films are, however, vulnerable to the excess existence of the inevitable hydrogen exposure during fabrication since its carrier is oxygen vacancies in ionic bonding. Therefore, the metal oxide device has a negatively shifted threshold voltage compared to a silicon based switching device. Induced hydrogen makes a coupling of hydrogen-oxygen based compounds, which leads to more oxygen vacancies in the channel region. Meanwhile, a back-to-back switching transistor ESD protection circuit is described to prevent excess current flowing to the active matrix device. The ESD protection circuit, which is located between an active matrix and periphery TAB bonding, comprises two gate-to-drain field effect transistors. When the metal oxide back to back switching device is at an 'off' state a zero voltage is applied. The ESD protection circuit thus has a higher current flow compared to with an amorphous silicon TFT protection circuit coupled between each electrode. The use of metal oxide switching transistors induces a large amount of current flow to the back-to-back transistors at the 'off' state. To overcome these concerns, a novel ESD protection back-to-back transistor design is described below.

The novel ESD protection back-to-back switching device is designed to cut the voltage of a large static discharge event. The ESD protection circuit stops the large signal that can burn the active area devices, which helps the stable operation of the detector.

An advantage of embodiments of the invention is that a high performance device can be used. A higher mobility metal oxide channel device is used instead of the conventional amorphous silicon based device. Metal oxide devices are used for the ESD circuit and for the array.

Another advantage of embodiments of the invention is stable device operation. The medical device, which can include for example a sensor array or image detector, is sensitive to electrostatic discharge (ESD) damage. The medical device is protected by the novel ESD protection design using a capacitor, in embodiments. The benefit of using one or more extra capacitors connected to the backto-back switching device is the cutoff of higher frequency signals. This in turn leads to improved imaging performance and stable device operation.

In summary, fast switching and stable performance of a medical diagnosis device is achievable by adopting a self-aligned bottom gate metal oxide structure for the active matrix area. By adopting metal oxide channel material rather than the conventional amorphous silicon, a fast switching device is realized. By applying an ESD protection metal oxide back-to-back switching device with additional capacitors, unwanted high frequency signals are filtered out, which leads to a stable device operation during medical diagnosis.

In a first embodiment, an ESD circuit comprises a first metal oxide channel device having a drain coupled to a first node, a source coupled to a second node, and a gate coupled to the first node; a second metal oxide channel device having a source coupled to the first node, a drain coupled to the second node, and a gate coupled to the second node; a first capacitor coupled between the first and second nodes proximate to the first metal oxide channel device; and a second capacitor coupled between the first and second nodes proximate to the second metal oxide channel device. The ESD circuit can further comprise a third capacitor coupled between the first and second nodes proximate to the first capacitor. The ESD circuit can further comprise a fourth capacitor coupled between the first and second nodes proximate to the second capacitor.

In a second embodiment, an integrated circuit comprises an internal node; an external node; a sensor array coupled to the internal node; and an ESD circuit comprising a first metal oxide channel device having a drain coupled to the internal node, a source coupled to the external node, and a gate coupled to the internal node; a second metal oxide channel device having a source coupled to the internal node, a drain coupled to the external node, and a gate coupled to the external node; a first capacitor coupled between the internal and external nodes proximate to the first metal oxide channel device; and a second capacitor coupled between the internal and external nodes proximate to the second metal oxide channel device. The ESD circuit can further comprise a third capacitor coupled between the internal and external nodes proximate to the first capacitor. The ESD circuit can further comprise a fourth capacitor coupled between the internal and external nodes proximate to the second capacitor.

In a third embodiment, a method comprises coupling a first metal oxide channel device having a drain to a first node, a source to a second node, and a gate to the first node; coupling a second metal oxide channel device having a source coupled to the first node, a drain to the second node, and a gate to the second node; coupling a first capacitor between the first and second nodes proximate to the first metal oxide channel device; and coupling a second capacitor between the first and second nodes proximate to the second metal oxide channel device. The method can further comprise coupling a third capacitor between the first and second nodes proximate to the first capacitor. The method can further comprise coupling a fourth capacitor between the first and second nodes proximate to the second capacitor.

In a fourth embodiment, a method includes providing an integrated circuit having an internal node, an external node, and a sensor array coupled to the internal node; and providing an ESD circuit comprising a first metal oxide channel device having a drain coupled to the internal node, a source coupled to the external node, and a gate coupled to the internal node; a second metal oxide channel device having a source coupled to the internal node, a drain coupled to the external node, and a gate coupled to the external node; a first capacitor coupled between the internal and external nodes proximate to the first metal oxide channel device; and a second capacitor coupled between the internal and external nodes proximate to the second metal oxide channel device. The method can further comprise coupling a third capacitor between the internal and external nodes proximate to the first capacitor. The method can further comprise coupling a fourth capacitor between the internal and external nodes proximate to the second capacitor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
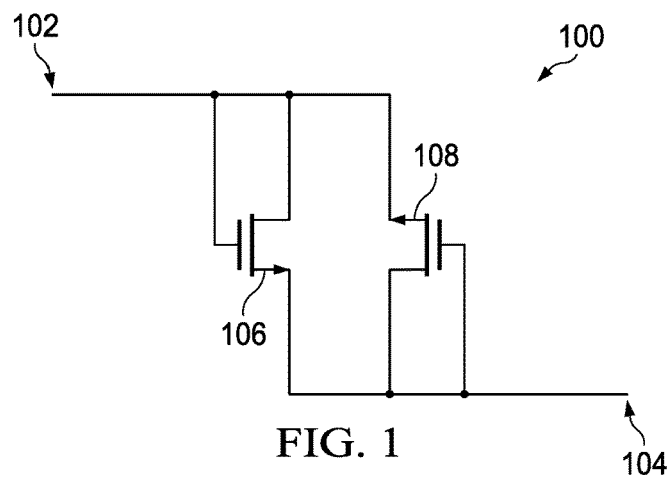
FIG. 1 is a circuit diagram of an ESD circuit according to an embodiment.

FIG. 1 shows a first embodiment of a back-to-Back TFT ESD protection circuit including a first amorphous silicon channel device 106 having a drain coupled to a first node 102, a source coupled to a second node 104, and a gate coupled to the first node 102. A second amorphous silicon channel device includes a source coupled to the first node 102, a drain coupled to the second node 104, and a gate coupled to the second node 104. The gate line 102 is coupled to a sensor array (best shown in FIG. 32) and the ESD bus 104 is coupled to an external pad (best shown in FIG. 32).

The first embodiment of the ESD protection circuit can use either amorphous silicon transistors or metal oxide transistors. The second, third, and fourth embodiments of the ESD protection are better suited for using metal oxide transistors, as is explained in further detail below.

FIGS. 2-8 are plan view diagrams of fabrication steps associated with the ESD circuit of FIG. 1.

Figure 2:
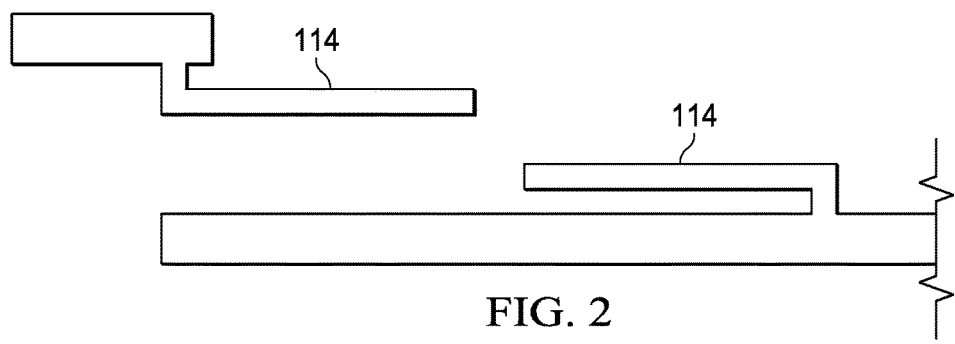
FIGS. 2-8 are plan view diagrams of fabrication steps associated with the ESD circuit of FIG. 1.

FIG. 2 shows the fabrication of the bottom gate 114 used in the first embodiment of the ESD protection circuit. A thin metal layer 114 is deposited and patterned using a lithographic process. A single or multi-stacked low sheet resistance metal is with a thickness range of about 1000 to 2000 Angstroms. Two features are created since there are two TFT devices in the ESD circuit.

Figure 3:
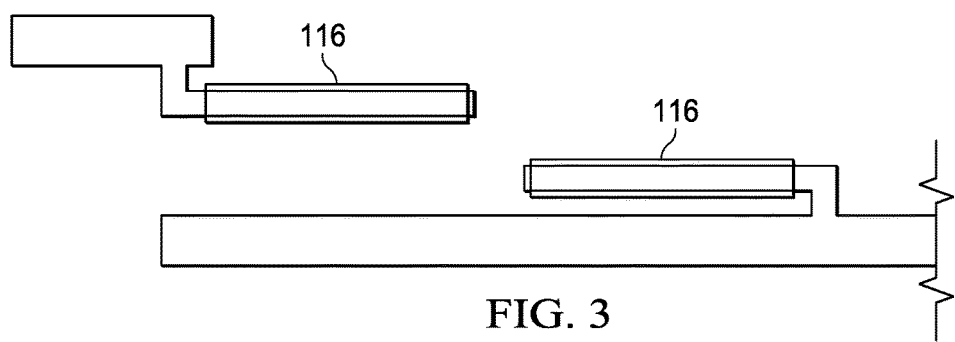

FIG. 3 shows the fabrication of the island 116 used in the first embodiment of the ESD protection circuit. A dielectric film, amorphous silicon channel layer, and channel passivation layers are deposited in series. The channel passivation is subsequently patterned. Two features are created since there are two TFT devices in the ESD circuit.

Figure 4:
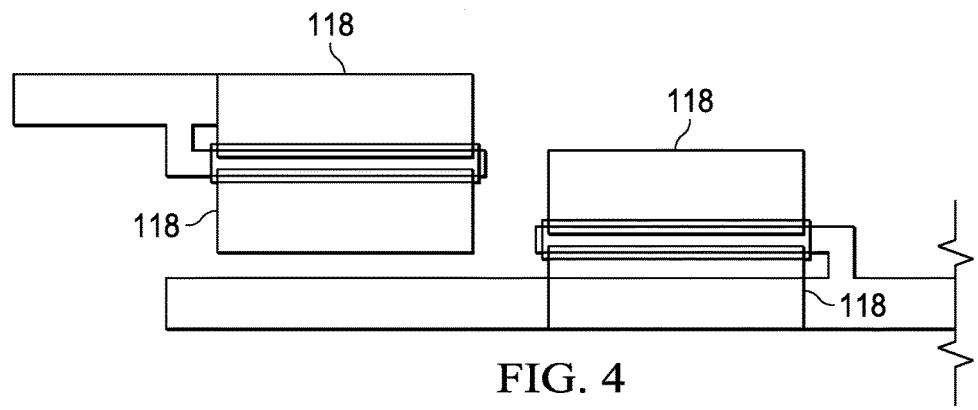

FIG. 4 shows the fabrication of the source and drain regions 118 used in the first embodiment of the ESD protection circuit. The source and drain metal is deposited to a thickness of about 1000 to 2000 Angstroms. The source and drain metal and the amorphous silicon channel layer are then patterned in series.

Figure 5:
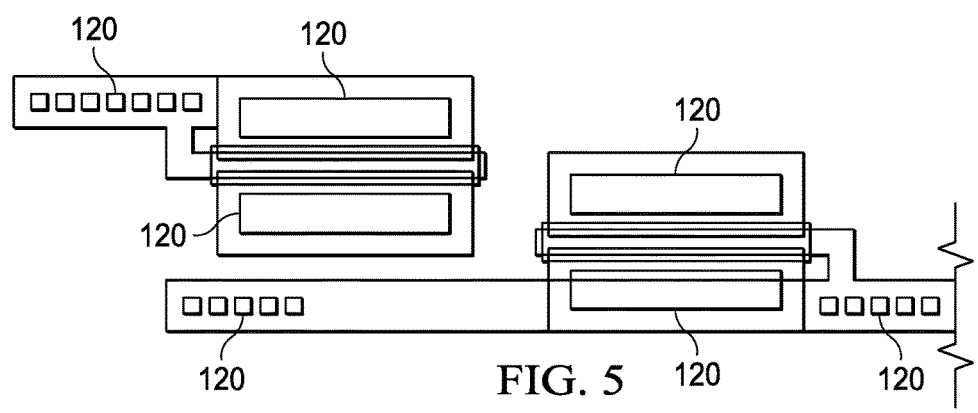

FIG. 5 shows the fabrication of the vias 120 used in the first embodiment of the ESD protection circuit. A dielectric film is deposited and via holes 120 are patterned to make contact between the amorphous silicon transistor and a plug-in metal layer. The plug-in metal layer is used to protect the underlying source and drain metal during the top layer etching process.

Figure 6:
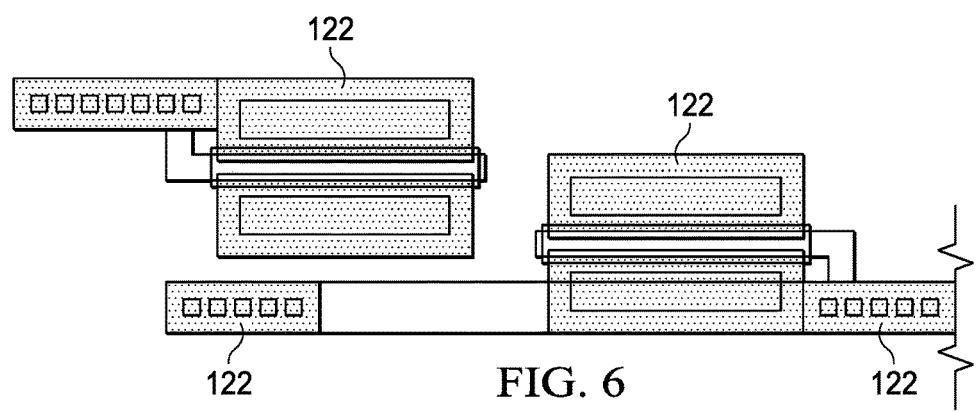
Figure 32:
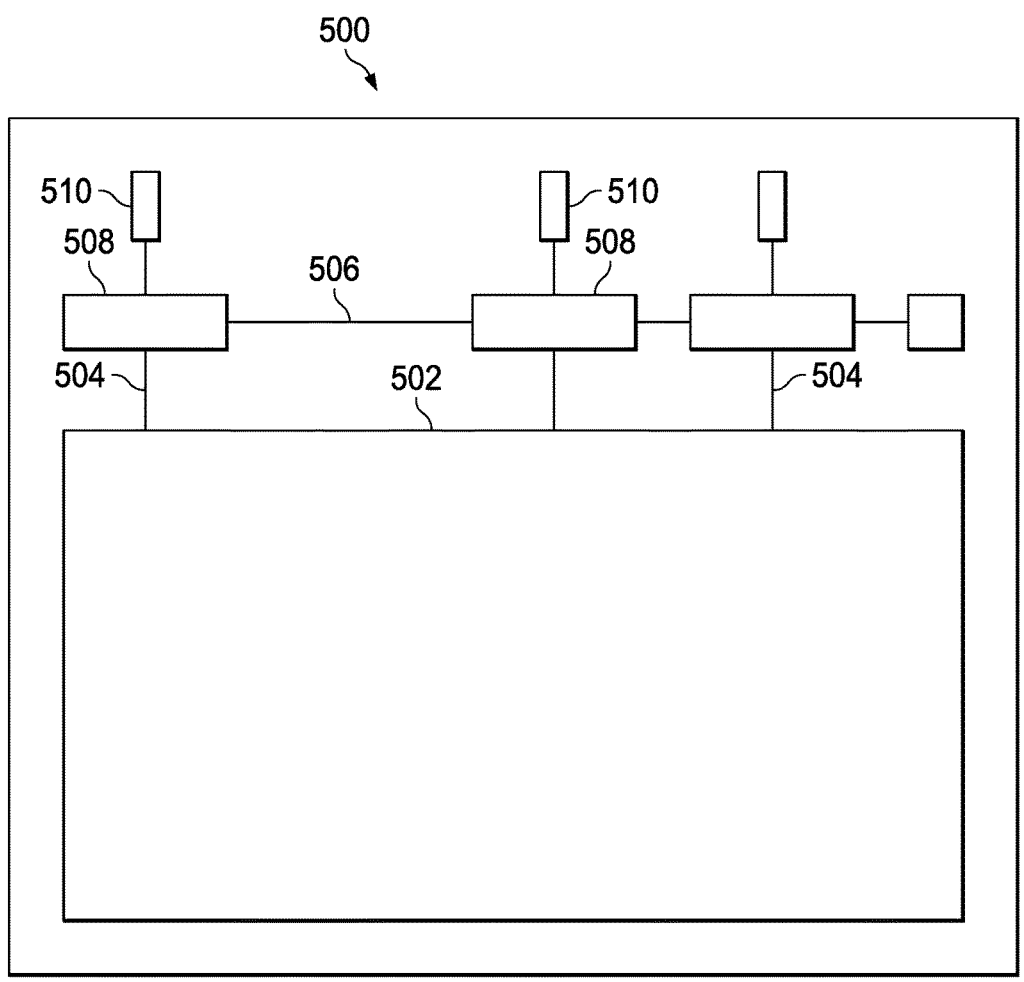
FIG. 32 is a plan view of an integrated circuit including a sensor array, ESD protection circuits, and bonding pads according to an embodiment.

FIG. 6 shows the fabrication of the CR features 122 used in the first embodiment of the ESD protection circuit. The CR features are the anode metal of a diode used in the sensor array, which in an embodiment uses Chromium. The diode electrode is deposited patterned in the pixels in the sensor array (sensor array is best shown in FIG. 32). The same metal layer is used for the plug-in metal layer having a thickness of about 2000 to 3000 Angstroms. A multi-stack metal layer can be used for the diode electrode.

Figure 7:
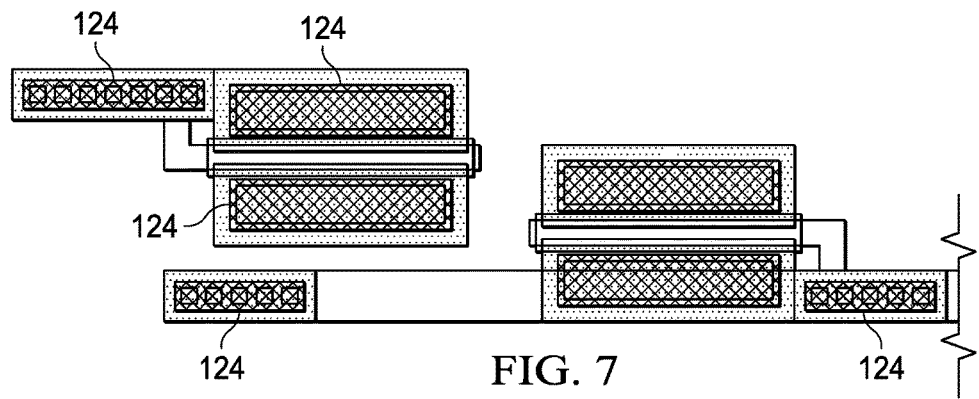

FIG. 7 shows the fabrication of a second via step (VIA2) used in the first embodiment of the ESD protection circuit. A dielectric film is deposited to passivate the pixels in the sensor array (best shown in FIG. 32). In order to make contact between the transistors and the data line vias 124 are formed.

Figure 8:
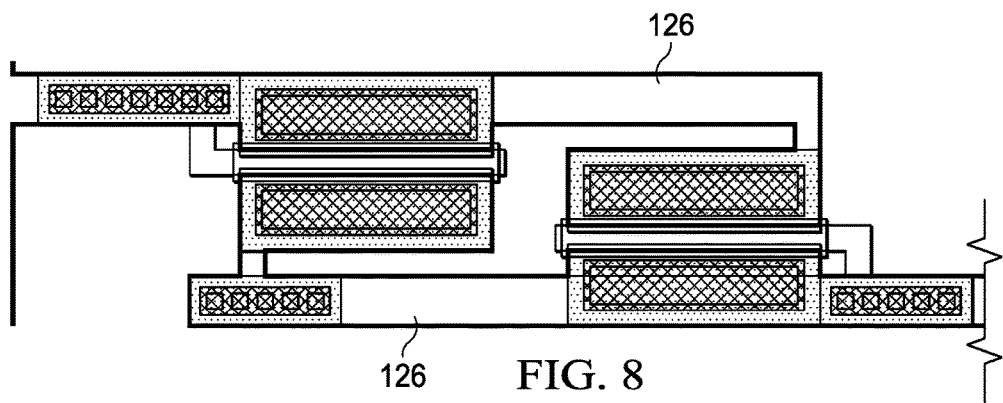

FIG. 8 shows the fabrication of a data line 126 used in the first embodiment of the ESD protection circuit. The data line is formed on the top of the ESD circuit TFT transistors with a multi-stack metal layer having a thickness of about 5000 to 10000 Angstroms. The ESD protection circuit is thus completely formed in FIG. 8. The dimensions of the ESD circuit shown in FIG. 8 are about 270 microns by 100 microns. The channel length of the transistors shown in FIG. 8 is about 9.5 microns, and the width of the transistors shown in FIG. 8 is about 100 microns. Thus the W/L ratio of the transistors shown in FIG. 8 is about 10.

Figure 9:
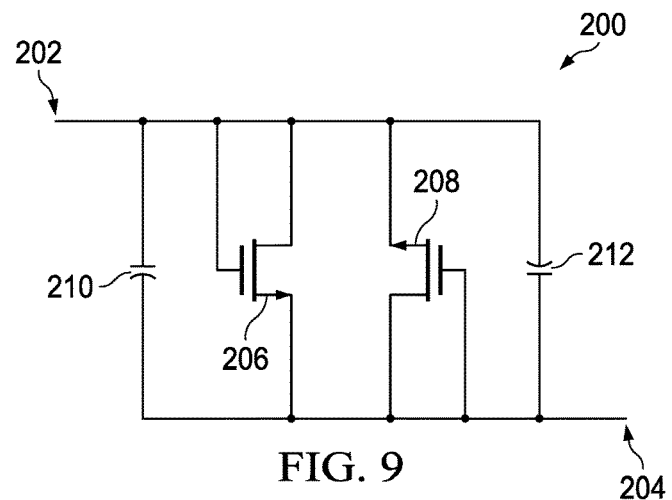
FIG. 9 is a circuit diagram of an ESD circuit according to another embodiment.

FIG. 9 shows a schematic diagram of a back-to-back TFT ESD protection circuit using metal oxide TFT devices according to the second embodiment. As is explained in further detail below, the TFT channel width is decreased compared to that of the first embodiment to match the TFT ON resistance of the amorphous silicon (a-Si) TFT due to the higher mobility of the metal oxide TFT. Additional capacitors are used to cut off unwanted high frequency signals and to compensate for overlap capacitance. Amorphous silicon transistors have a higher overlap capacitance because the output power of an amorphous silicon transistor is proportional to the shared overlap area between the gate and source/drain metal electrode. Metal oxide transistors have a higher mobility than amorphous silicon transistors, which makes a smaller overlap area transistor. Thus, to compensate the capacitance loss by the smaller transistor widths of metal oxide transistors, an additional capacitor is required.

FIG. 9 shows the second embodiment of a back-to-Back TFT ESD protection circuit including a first metal oxide channel device 206 having a drain coupled to a first node 202, a source coupled to a second node 204, and a gate coupled to the first node 202. A second metal oxide channel device includes a source coupled to the first node 202, a drain coupled to the second node 204, and a gate coupled to the second node 204. The second embodiment also includes a first capacitor 210 that is physically proximate to the first transistor 206 and a second capacitor 212 that is physically proximate to the second transistor 208, as will be explained in further detail below. The gate line 202 is coupled to a sensor array (best shown in FIG. 32) and the ESD bus 204 is coupled to an external pad (best shown in FIG. 32).

FIGS. 10-16 are plan view diagrams of fabrication steps associated with the ESD circuit of FIG. 9.

Figure 10:
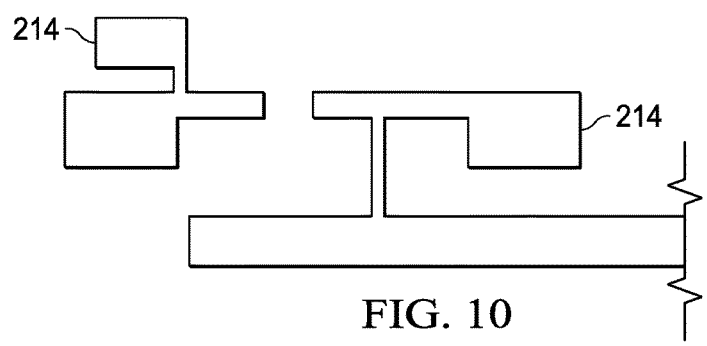
FIGS. 10-16 are plan view diagrams of fabrication steps associated with the ESD circuit of FIG. 9.

FIG. 10 shows the fabrication of the bottom gate 214 used in the second embodiment of the ESD protection circuit. A thin metal layer 214 is deposited and patterned using a lithographic process. A single or multi-stacked low sheet resistance metal is with a thickness range of about 1000 to 2000 Angstroms. Two features are created since there are two TFT devices in the ESD circuit.

Figure 11:
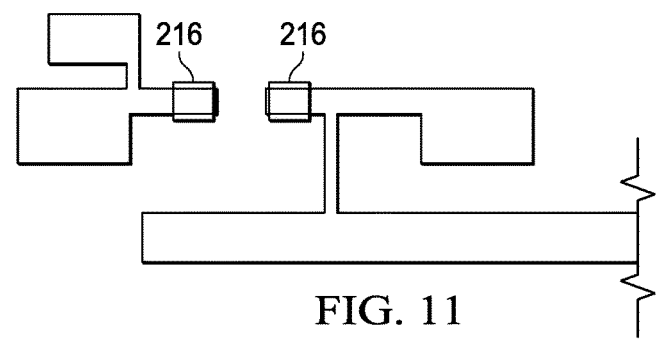

FIG. 11 shows the fabrication of the island 216 used in the second embodiment of the ESD protection circuit. A dielectric film, metal oxide channel layer, and channel passivation layers are deposited in series. The channel passivation is subsequently patterned. Two features are created since there are two TFT devices in the ESD circuit.

Figure 12:
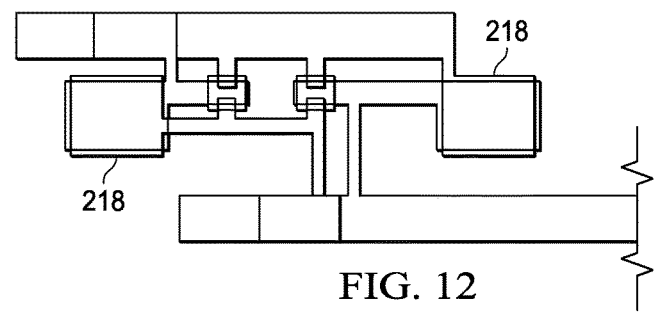

FIG. 12 shows the fabrication of the source and drain regions 218 used in the second embodiment of the ESD protection circuit. The source and drain metal is deposited to a thickness of about 1000 to 2000 Angstroms. The source and drain metal and the metal oxide channel layer are then patterned in series.

Figure 13:
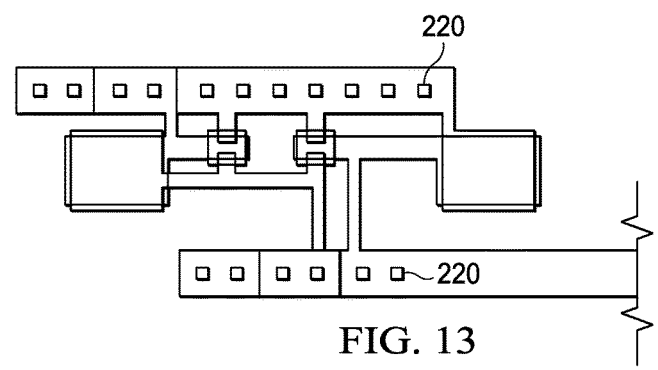

FIG. 13 shows the fabrication of the vias 220 used in the second embodiment of the ESD protection circuit. A dielectric film is deposited and via holes 220 are patterned to make contact between the metal oxide transistor and plug-in metal layer.

Figure 14:
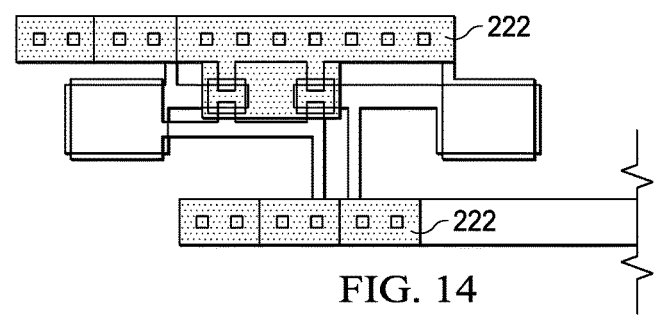

FIG. 14 shows the fabrication of the CR features 222 used in the second embodiment of the ESD protection circuit. A diode electrode is deposited patterned in the pixels in the sensor array (best shown in FIG. 32). The same metal layer is used for the plug-in metal layer having a thickness of about 2000 to 3000 Angstroms. A multi-stack metal layer can be used for the diode electrode.

Figure 15:
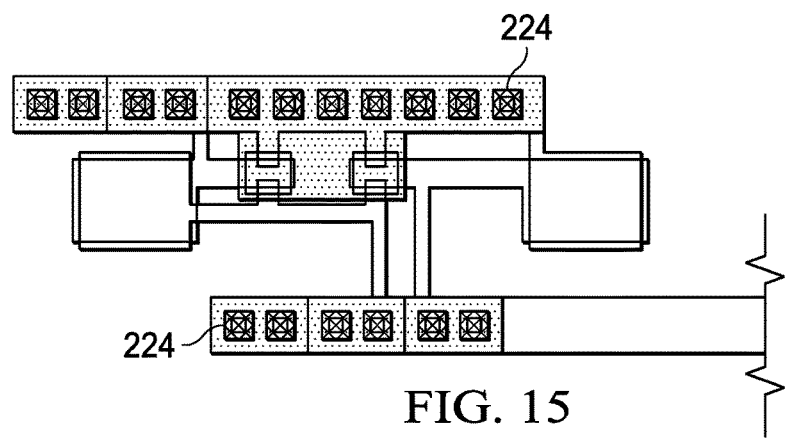

FIG. 15 shows the fabrication of a second via step (VIA2) used in the second embodiment of the ESD protection circuit. A dielectric film is deposited to passivate the pixels in the sensor array (best shown in FIG. 32). In order to make contact between the transistors and the data line vias 224 are formed.

Figure 16:
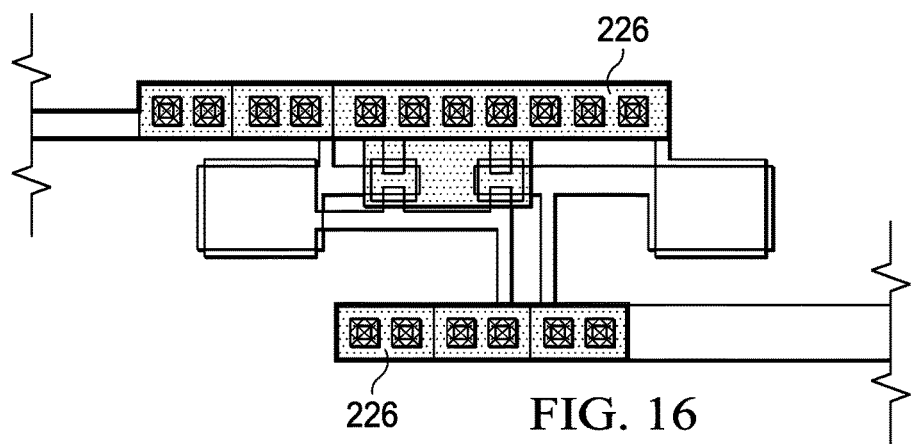

FIG. 16 shows the fabrication of a data line 226 used in the second embodiment of the ESD protection circuit. The data line is formed on the top of the ESD circuit TFT transistors with a multi-stack metal layer having a thickness of about 5000 to 10000 Angstroms. The ESD protection circuit is thus completely formed in FIG. 16. The channel length of the transistors shown in FIG. 16 is about 9.5 microns, and the width of the transistors shown in FIG. 16 is about 7.5 microns. Thus the W/L ratio of the transistors shown in FIG. 16 is about 0.8.

Figure 17:
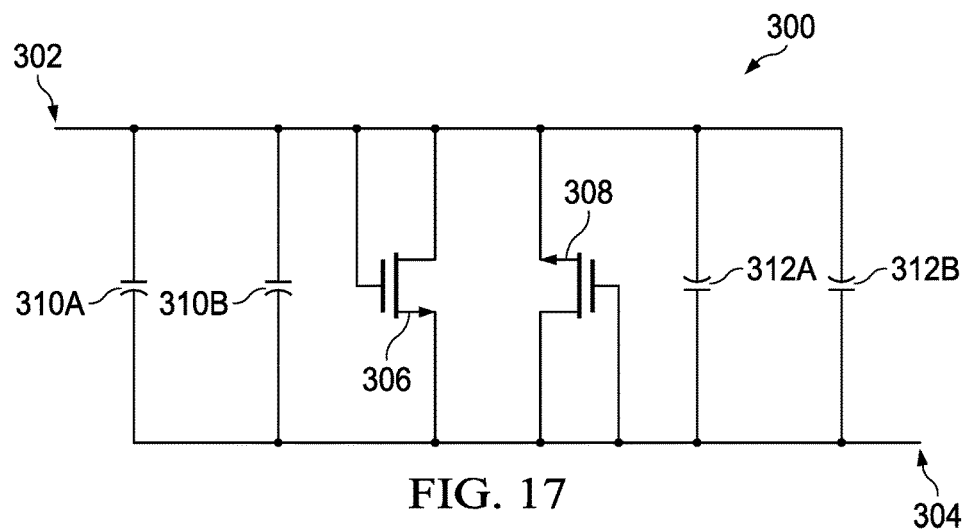
FIG. 17 is a circuit diagram of an ESD circuit according to another embodiment.

FIG. 17 shows a schematic diagram of a back-to-back TFT ESD protection circuit according to the third embodiment. The circuit design shown in FIG. 17 shares aspects with the circuit design shown in FIG. 9. The physical capacitors shown in FIG. 9 can be implemented with multiple capacitors connected in parallel for manufacturability reasons. For example, larger-sized metal electrodes can make charges build up during the manufacturing process.

FIG. 17 shows the third embodiment of a back-to-Back TFT ESD protection circuit including a first metal oxide channel device 306 having a drain coupled to a first node 302, a source coupled to a second node 304, and a gate coupled to the first node 302. A second metal oxide channel device includes a source coupled to the first node 302, a drain coupled to the second node 304, and a gate coupled to the second node 304. The third embodiment also includes a first capacitor 310A that is physically proximate to the first transistor 306 and a second capacitor 312A that is physically proximate to the second transistor 308, as will be explained in further detail below. The third embodiment also includes a third capacitor 310 that is physically proximate to the first transistor 306 and a second capacitor 312B that is physically proximate to the second transistor 308, as will be explained in further detail below. The gate line 302 is coupled to a sensor array (best shown in FIG. 32) and the ESD bus 304 is coupled to an external pad (best shown in FIG. 32).

FIGS. 18-24 are plan view diagrams of fabrication steps associated with the ESD circuit of FIG. 17.

Figure 18:
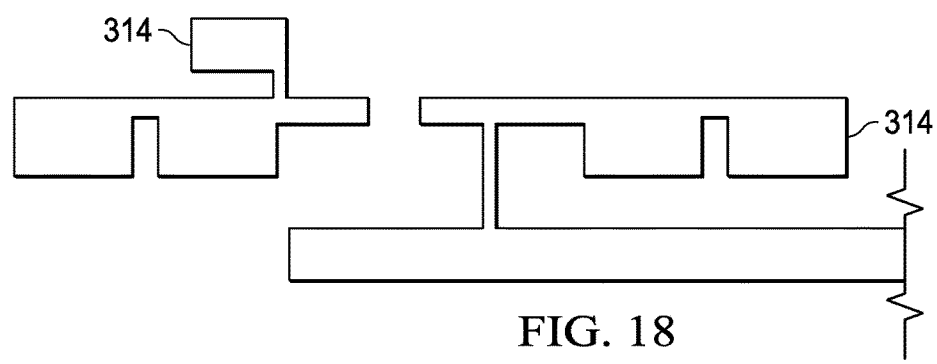
FIGS. 18-31 are plan view diagrams of fabrication steps associated with the ESD circuit of FIG. 17.

FIG. 18 shows the fabrication of the bottom gate 314 used in the third embodiment of the ESD protection circuit. A thin metal layer 314 is deposited and patterned using a lithographic process. A single or multi-stacked low sheet resistance metal is with a thickness range of about 1000 to 2000 Angstroms. Two features are created since there are two TFT devices in the ESD circuit.

Figure 19:
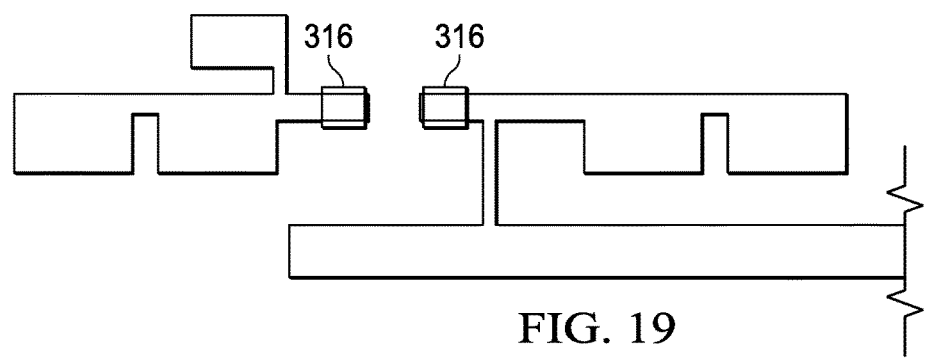

FIG. 19 shows the fabrication of the island 316 used in the third embodiment of the ESD protection circuit. A dielectric film, metal oxide channel layer, and channel passivation layers are deposited in series. The channel passivation is subsequently patterned. Two features are created since there are two TFT devices in the ESD circuit.

Figure 20:
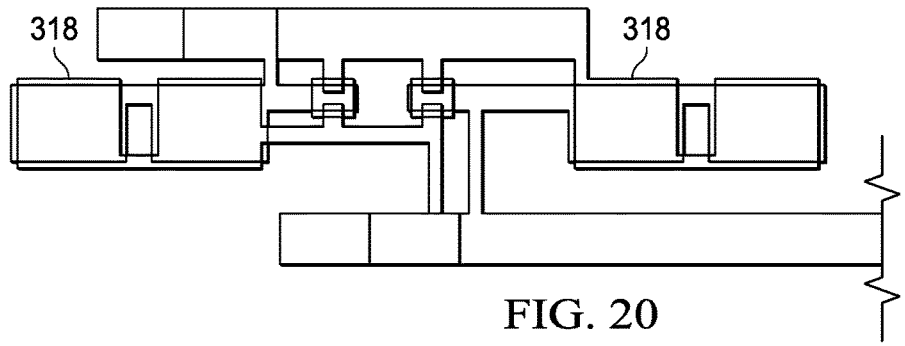

FIG. 20 shows the fabrication of the source and drain regions 318 used in the third embodiment of the ESD protection circuit. The source and drain metal is deposited to a thickness of about 1000 to 2000 Angstroms. The source and drain metal and the metal oxide channel layer are then patterned in series.

Figure 21:
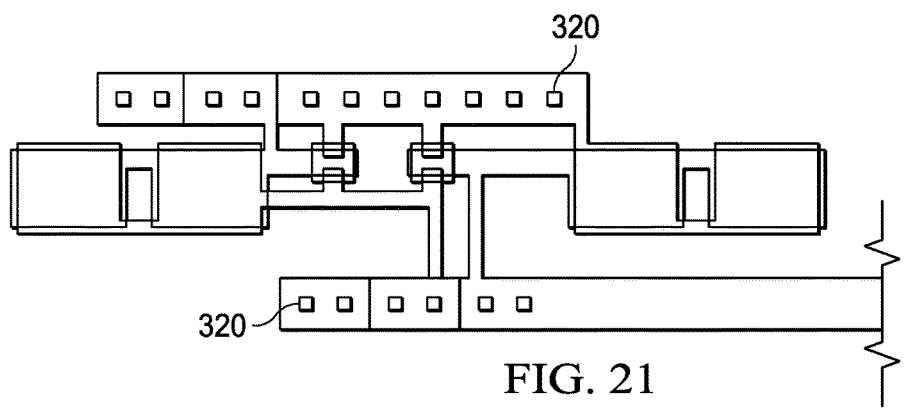

FIG. 21 shows the fabrication of the vias 320 used in the third embodiment of the ESD protection circuit. A dielectric film is deposited and via holes 320 are patterned to make contact between the metal oxide transistor and plug-in metal layer.

Figure 22:
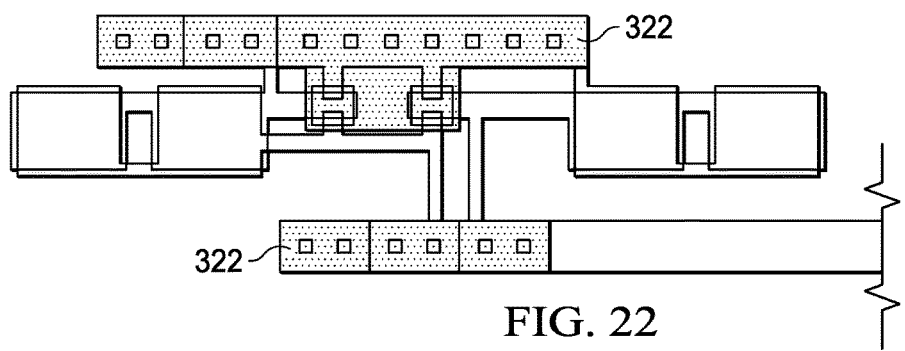

FIG. 22 shows the fabrication of the CR features 322 used in the third embodiment of the ESD protection circuit. A diode electrode is deposited patterned in the pixels in the sensor array (best shown in FIG. 32). The same metal layer is used for the plug-in metal layer having a thickness of about 2000 to 3000 Angstroms. A multi-stack metal layer can be used for the diode electrode.

Figure 23:
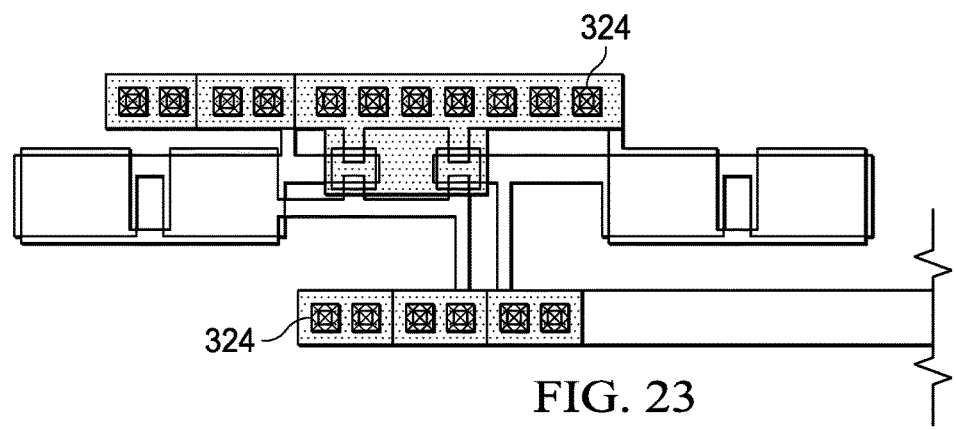

FIG. 23 shows the fabrication of a second via step (VIA2) used in the third embodiment of the ESD protection circuit. A dielectric film is deposited to passivate the pixels in the sensor array (best shown in FIG. 32). In order to make contact between the transistors and the data line vias 324 are formed.

Figure 24:
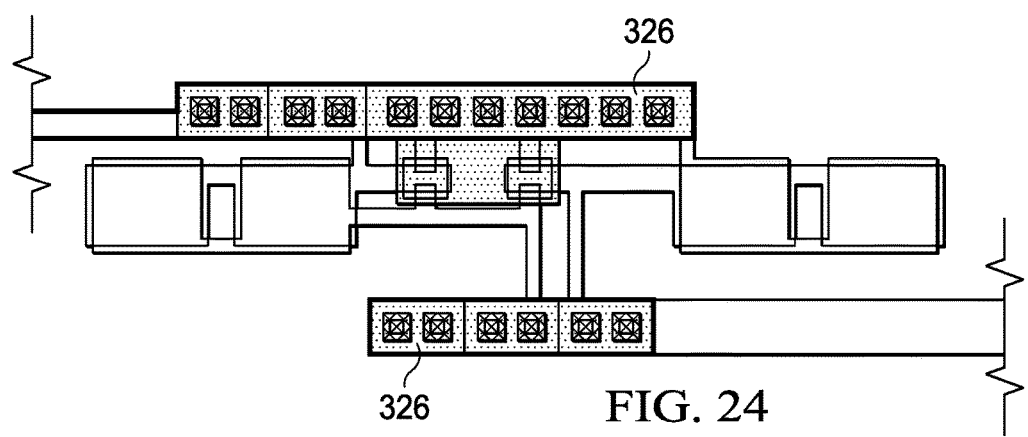

FIG. 24 shows the fabrication of a data line 326 used in the third embodiment of the ESD protection circuit. The data line is formed on the top of the ESD circuit TFT transistors with a multi-stack metal layer having a thickness of about 5000 to 10000 Angstroms. The ESD protection circuit is thus completely formed in FIG. 24. The dimensions of the ESD circuit shown in FIG. 24 are about 315 microns by 100 microns. The channel length of the transistors shown in FIG. 24 is about 9.5 microns, and the width of the transistors shown in FIG. 16 is about 7.5 microns. Thus the W/L ratio of the transistors shown in FIG. 16 is about 0.8.

FIGS. 25-31 are plan view diagrams of fabrication steps associated with the same ESD circuit of FIG. 17, but according to a fourth embodiment. One difference between the third and fourth embodiments is that in the fourth embodiment, the TFT channel length is increased while the width is the same as previously described (7.5 microns, in an embodiment) to minimize the effects of hydrogen that makes the channel conductive.

Figure 25:
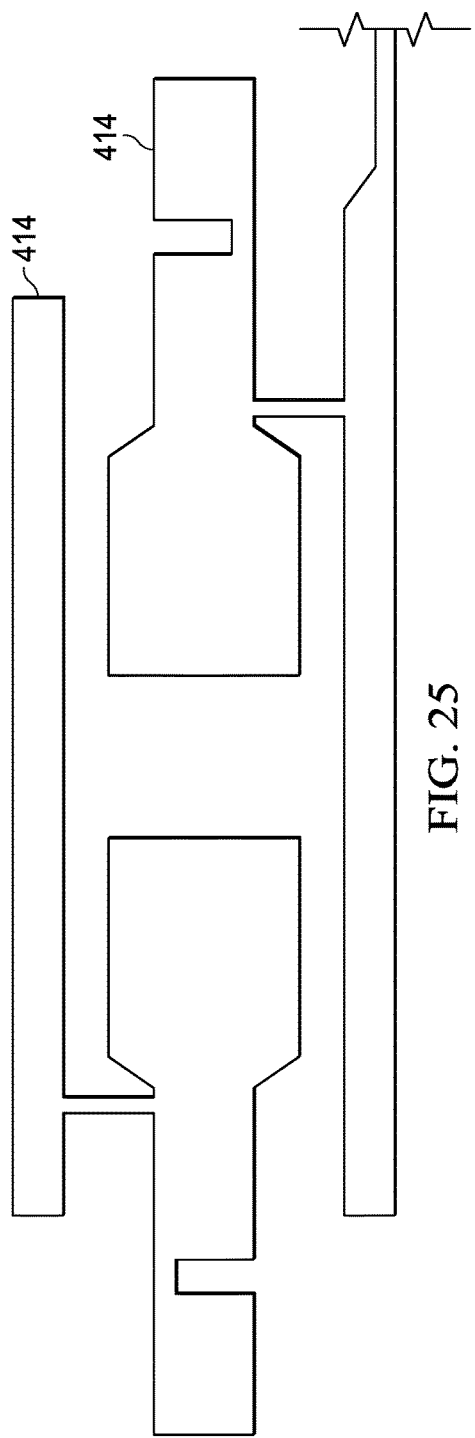

FIG. 25 shows the fabrication of the bottom gate 414 used in the fourth embodiment of the ESD protection circuit. A thin metal layer 414 is deposited and patterned using a lithographic process. A single or multi-stacked low sheet resistance metal is with a thickness range of about 1000 to 2000 Angstroms. Two features are created since there are two TFT devices in the ESD circuit.

Figure 26:
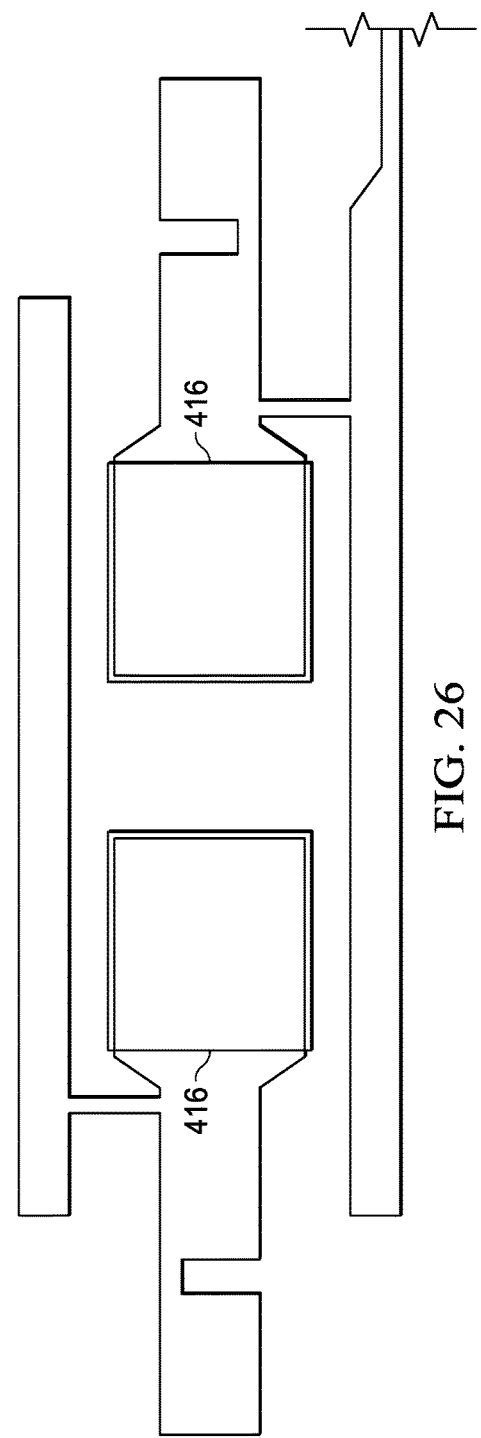

FIG. 26 shows the fabrication of the island 416 used in the fourth embodiment of the ESD protection circuit. A dielectric film, metal oxide channel layer, and channel passivation layers are deposited in series. The channel passivation is subsequently patterned. Two features are created since there are two TFT devices in the ESD circuit.

Figure 27:
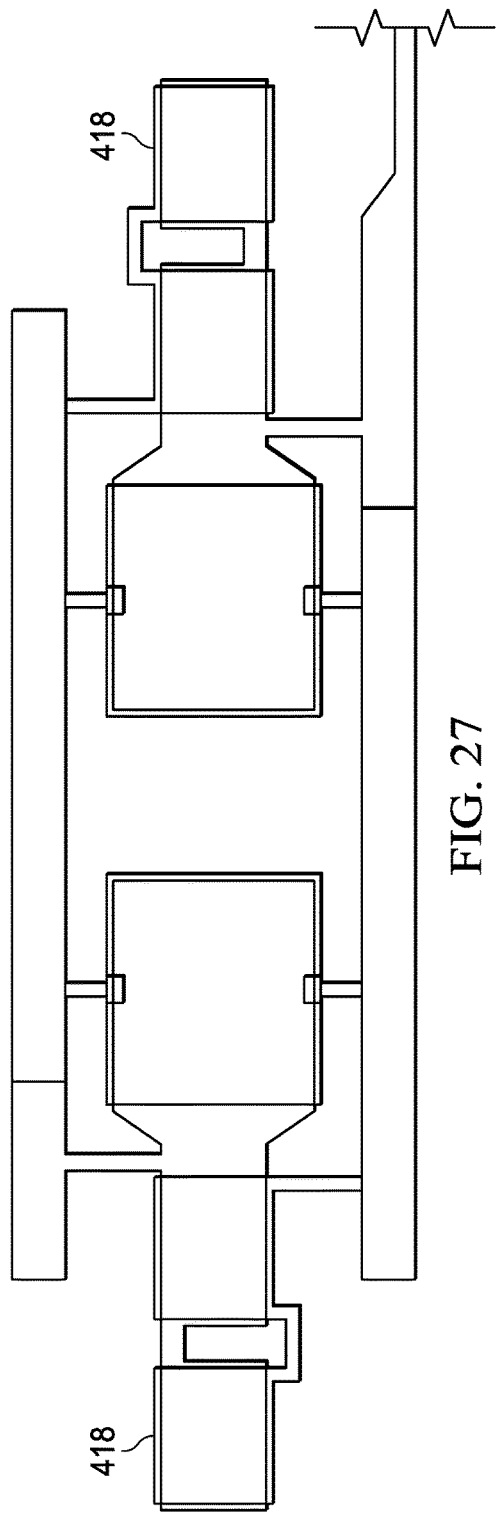

FIG. 27 shows the fabrication of the source and drain regions 418 used in the fourth embodiment of the ESD protection circuit. The source and drain metal is deposited to a thickness of about 1000 to 2000 Angstroms. The source and drain metal and the metal oxide channel layer are then patterned in series.

Figure 28:
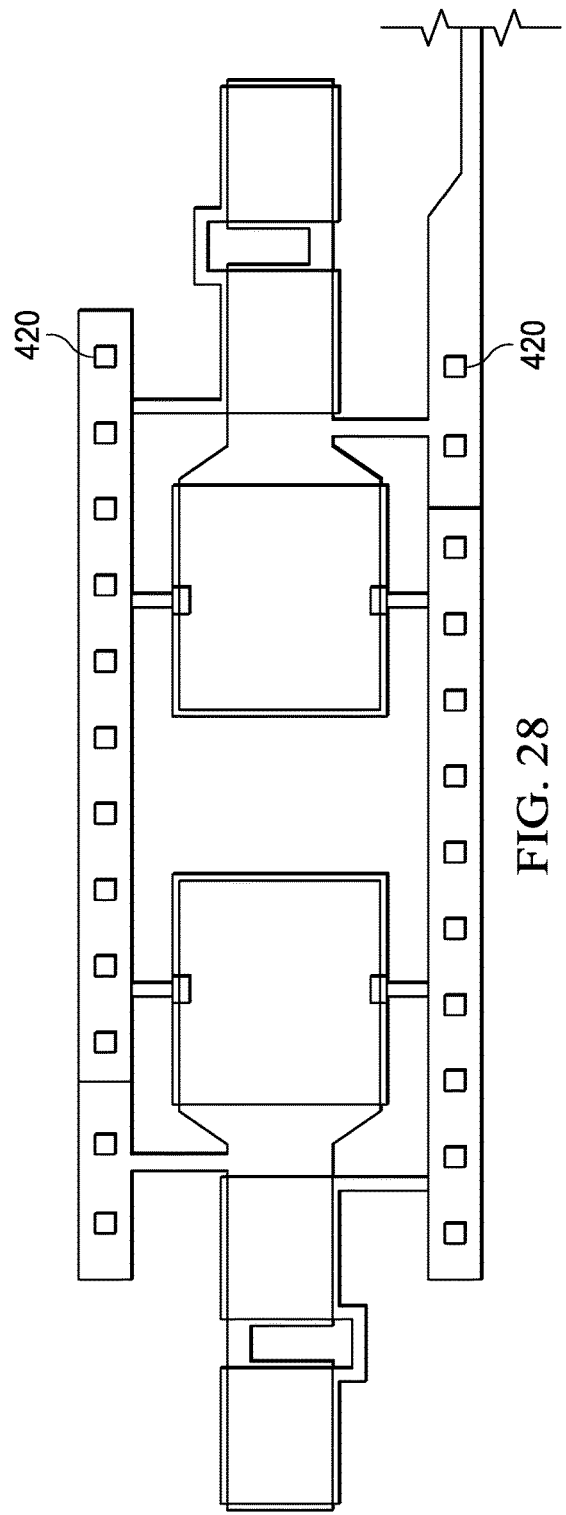

FIG. 28 shows the fabrication of the vias 420 used in the fourth embodiment of the ESD protection circuit. A dielectric film is deposited and via holes 420 are patterned to make contact between the metal oxide transistor and plug-in metal layer.

Figure 29:
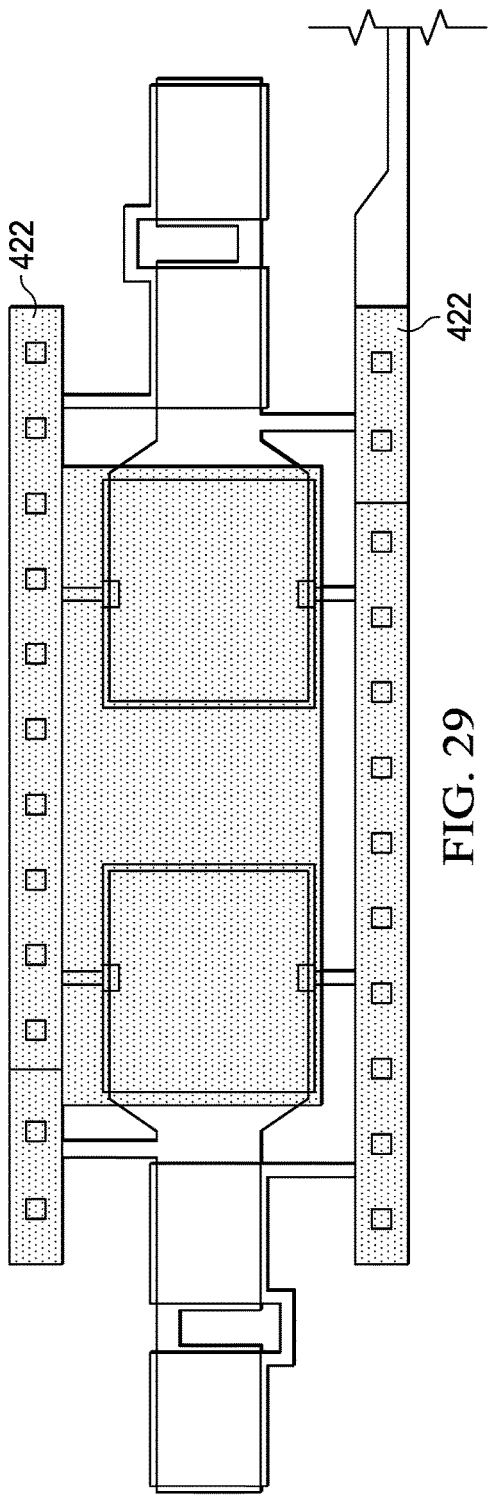

FIG. 29 shows the fabrication of the CR features 422 used in the third embodiment of the ESD protection circuit. A diode electrode is deposited patterned in the pixels in the sensor array (best shown in FIG. 32). The same metal layer is used for the plug-in metal layer having a thickness of about 2000 to 3000 Angstroms. A multi-stack metal layer can be used for the diode electrode.

Figure 30:
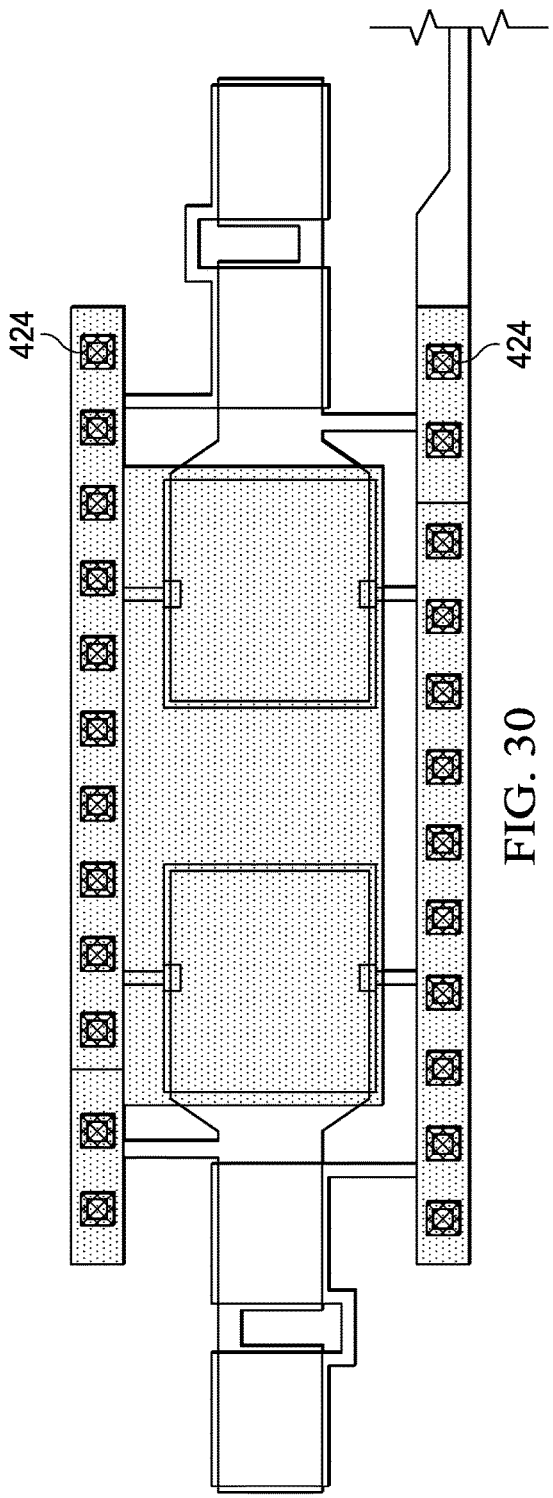

FIG. 30 shows the fabrication of a second via step (VIA2) used in the fourth embodiment of the ESD protection circuit. A dielectric film is deposited to passivate the pixels in the sensor array (best shown in FIG. 32). In order to make contact between the transistors and the data line vias 424 are formed.

Figure 31:
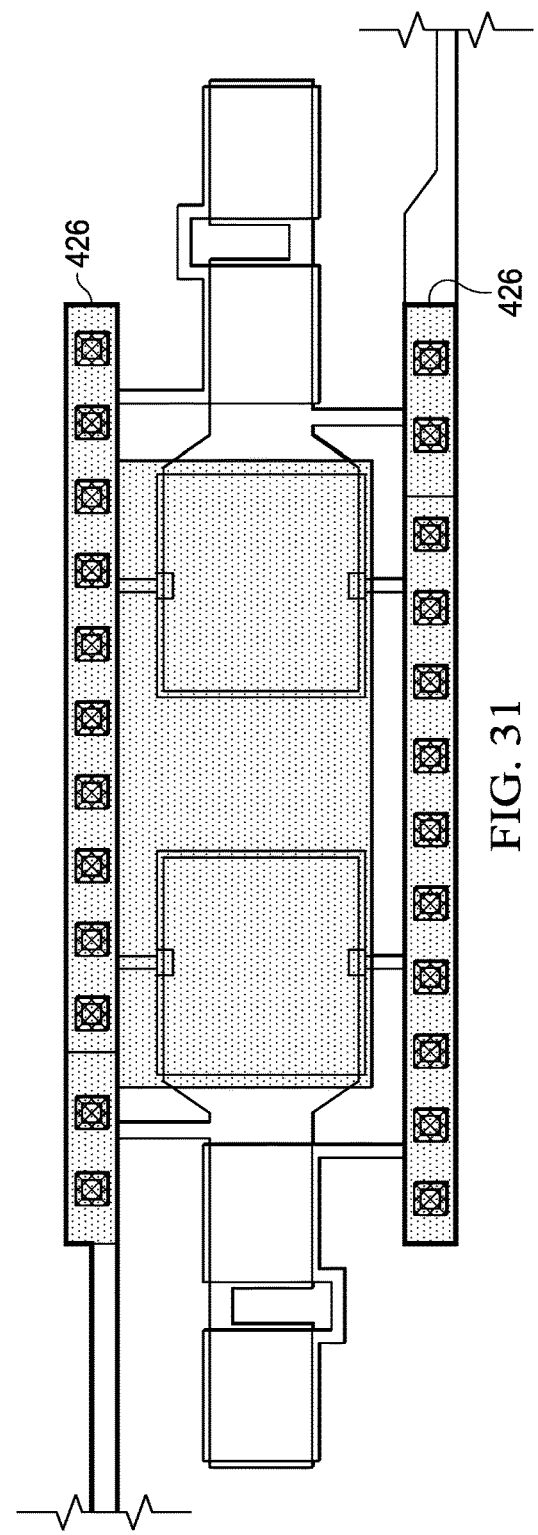

FIG. 31 shows the fabrication of a data line 426 used in the fourth embodiment of the ESD protection circuit. The data line is formed on the top of the ESD circuit TFT transistors with a multi-stack metal layer having a thickness of about 5000 to 10000 Angstroms. The ESD protection circuit is thus completely formed in FIG. 31. The dimensions of the ESD circuit shown in FIG. 31 are about 415 microns by 117 microns. The channel length of the transistors shown in FIG. 31 is about 59 microns, and the width of the transistors shown in FIG. 31 is about 75 microns. Thus the W/L ratio of the transistors shown in FIG. 31 is about 0.13.

FIG. 32 shows a plan view of an integrated circuit including a sensor array, ESD circuits, and ESD bonding pads, according to an embodiment. Integrated circuit 500 includes a sensor array 502 including light sensitive pixels and gate lines 504 as well as other features known to those skilled in the art. ESD protection circuits 508 that were previously described are coupled between the gate lines 504 and the ESD bus 506 as shown. The ESD bus, in turn, is coupled to ground or to an appropriate source of power supply voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. An ESD circuit comprising:
   a first metal oxide channel device having a drain coupled to a first node, a source coupled to a second node, and a gate coupled to the first node;
   a second metal oxide channel device having a source coupled to the first node, a drain coupled to the second node, and a gate coupled to the second node;
   a first capacitor coupled between the first and second nodes proximate to the first metal oxide channel device; and
   a second capacitor coupled between the first and second nodes proximate to the second metal oxide channel device.

2. The ESD circuit of claim 1, further comprising a third capacitor coupled between the first and second nodes proximate to the first capacitor.

3. The ESD circuit of claim 1, further comprising a fourth capacitor coupled between the first and second nodes proximate to the second capacitor.

4. The ESD circuit of claim 1, wherein a width to length ratio of the first and second transistors is substantially equal to 0.8.

5. The ESD circuit of claim 1, wherein a width of the first and second transistors is about 7.5 microns and a length of the first and second transistors is about 9.5 microns.

6. An integrated circuit comprising:
   an internal node;
   an external node;
   a sensor array coupled to the internal node; and
   an ESD circuit comprising a first metal oxide channel device having a drain coupled to the internal node, a source coupled to the external node, and a gate coupled to the internal node; a second metal oxide channel device having a source coupled to the internal node, a drain coupled to the external node, and a gate coupled to the external node; a first capacitor coupled between the internal and external nodes proximate to the first metal oxide channel device; and a second capacitor coupled between the internal and external nodes proximate to the second metal oxide channel device.

7. The integrated circuit of claim 1, further comprising a third capacitor coupled between the internal and external nodes proximate to the first capacitor.

8. The integrated circuit of claim 1, further comprising a fourth capacitor coupled between the internal and external nodes proximate to the second capacitor.

9. The integrated circuit of claim 1, wherein a width to length ratio of the first and second transistors is substantially equal to 0.8.

10. The integrated circuit of claim 1, wherein a width of the first and second transistors is about 7.5 microns and a length of the first and second transistors is about 9.5 microns.

11. A method comprising:
    coupling a first metal oxide channel device having a drain to a first node, a source to a second node, and a gate to the first node;
    coupling a second metal oxide channel device having a source coupled to the first node, a drain to the second node, and a gate to the second node;
    coupling a first capacitor between the first and second nodes proximate to the first metal oxide channel device; and
    coupling a second capacitor between the first and second nodes proximate to the second metal oxide channel device.

12. The method of claim 11, further comprising coupling a third capacitor between the first and second nodes proximate to the first capacitor.

13. The method of claim 11, further comprising coupling a fourth capacitor between the first and second nodes proximate to the second capacitor.

14. The method of claim 11, further comprising setting a width to length ratio of the first and second transistors substantially equal to 0.8.

15. The method of claim 11, further comprising setting a width of the first and second transistors to about 7.5 microns and a length of the first and second transistors to about 9.5 microns.

16. A method comprising:
    providing an integrated circuit having an internal node, an external node, and a sensor array coupled to the internal node; and
    providing an ESD circuit comprising a first metal oxide channel device having a drain coupled to the internal node, a source coupled to the external node, and a gate coupled to the internal node; a second metal oxide channel device having a source coupled to the internal node, a drain coupled to the external node, and a gate coupled to the external node; a first capacitor coupled between the internal and external nodes proximate to the first metal oxide channel device; and a second capacitor coupled between the internal and external nodes proximate to the second metal oxide channel device.

17. The method of claim 16, further comprising coupling a third capacitor between the internal and external nodes proximate to the first capacitor.

18. The method of claim 16, further comprising coupling a fourth capacitor between the internal and external nodes proximate to the second capacitor.

19. The method of claim 16, further comprising setting a width to length ratio of the first and second transistors substantially equal to 0.8.

20. The method of claim 16, further comprising setting a width of the first and second transistors to about 7.5 microns and a length of the first and second transistors to about 9.5 microns.

* * * * *